United States Patent
Butenhoff et al.

(10) Patent No.: US 9,791,521 B2
(45) Date of Patent: Oct. 17, 2017

(54) SYSTEMS AND METHODS FOR OPERATING A HALL-EFFECT SENSOR WITHOUT AN APPLIED MAGNETIC FIELD

(71) Applicant: TEXAS INSTRUMENTS INCORPORATED, Dallas, TX (US)

(72) Inventors: Michael Edwin Butenhoff, Minnesota City, MN (US); Keith Ryan Green, Prosper, TX (US); Anuj Jain, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 286 days.

(21) Appl. No.: 14/670,078

(22) Filed: Mar. 26, 2015

(65) Prior Publication Data

US 2015/0276892 A1 Oct. 1, 2015

Related U.S. Application Data

(60) Provisional application No. 61/971,368, filed on Mar. 27, 2014.

(51) Int. Cl.
  *G01R 33/06* (2006.01)
  *G01R 33/00* (2006.01)
  *G01R 33/07* (2006.01)

(52) U.S. Cl.
  CPC ....... *G01R 33/0023* (2013.01); *G01R 33/072* (2013.01)

(58) Field of Classification Search
  CPC  G01R 33/0206; G01R 33/028; G01R 33/038; G01R 33/1215; G01R 33/07; G01R 33/077; G01R 33/075; G01R 33/0283; G01R 15/20; G01R 15/202; G01R 21/08; G01R 1/20; G01R 1/22; G01R 11/06; G01R 19/20; G06G 7/162; G05G 2009/04755; G01D 5/142; B64G 1/366
  USPC ..... 324/202, 207.2, 225, 251, 117 H, 117 R, 324/763, 260; 338/32 H; 257/E43.002
  See application file for complete search history.

(56) References Cited

U.S. PATENT DOCUMENTS

| | | | | |
|---|---|---|---|---|
| 5,032,791 A | * | 7/1991 | Bates, Jr. | ........... G01R 33/1253 324/117 H |
| 5,343,145 A | * | 8/1994 | Wellman | .................. G05B 9/02 180/168 |
| 5,604,433 A | * | 2/1997 | Theus | .................... G01R 33/07 324/225 |
| 6,424,143 B1 | * | 7/2002 | Blossfeld | ................. G01D 3/08 324/160 |

(Continued)

FOREIGN PATENT DOCUMENTS

CN      103278788 A  *  9/2013

*Primary Examiner* — Jermele M Hollington
*Assistant Examiner* — Sean Curtis
(74) *Attorney, Agent, or Firm* — Lawrence J. Bassuk; Charles A. Brill; Frank D. Cimino

(57) ABSTRACT

A method for verifying an operation of a Hall-effect sensor without an applied magnetic field. The method can include providing a bias signal to a first pair of terminals of a Hall-effect element, applying a Hall current signal to a second pair of terminals of the Hall-effect element, measuring a Hall output voltage across the second pair of terminals and comparing the measured Hall output voltage to an expected Hall output voltage that would be provided by a corresponding applied magnetic field.

17 Claims, 4 Drawing Sheets

(56) References Cited

U.S. PATENT DOCUMENTS

| | | | | |
|---|---|---|---|---|
| 6,476,602 B1* | 11/2002 | Gray | B82Y 10/00 | 324/210 |
| 6,759,844 B2* | 7/2004 | Kliemannel | G01R 33/07 | 324/251 |
| 8,098,062 B2* | 1/2012 | Kilian | H03K 19/18 | 324/207.2 |
| 8,258,780 B2* | 9/2012 | Smith | G01P 3/487 | 324/202 |
| 8,258,795 B2* | 9/2012 | Fink | G01D 3/08 | 324/537 |
| 8,447,556 B2* | 5/2013 | Friedrich | G01R 33/0023 | 702/116 |
| 8,542,010 B2* | 9/2013 | Cesaretti | G01R 35/005 | 324/202 |
| 8,680,846 B2* | 3/2014 | Cesaretti | G01R 33/0035 | 324/202 |
| 8,723,515 B2* | 5/2014 | Motz | G01R 33/0029 | 324/117 H |
| 8,754,640 B2* | 6/2014 | Vig | G01R 33/072 | 324/202 |
| 8,797,026 B2* | 8/2014 | Kilian | H03K 19/18 | 324/117 H |
| 8,878,529 B2* | 11/2014 | Baecher | G01D 3/08 | 324/117 H |
| 8,890,518 B2* | 11/2014 | Daubert | G01R 33/0029 | 324/207.2 |
| 9,013,167 B2* | 4/2015 | Antonacci | G01R 33/0029 | 323/294 |
| 9,035,648 B2* | 5/2015 | Figaro | G01R 33/02 | 324/244 |
| 2002/0024109 A1* | 2/2002 | Hayat-Dawoodi | G01R 33/07 | 257/421 |
| 2008/0143329 A1* | 6/2008 | Ishihara | G01R 33/07 | 324/251 |
| 2010/0060264 A1* | 3/2010 | Smith | G01P 3/487 | 324/202 |
| 2011/0234813 A1* | 9/2011 | Baecher | G01D 3/08 | 348/187 |
| 2012/0112733 A1* | 5/2012 | Antonacci | G01R 33/072 | 323/368 |
| 2012/0313635 A1* | 12/2012 | Daubert | G01R 33/077 | 324/251 |
| 2013/0009636 A1* | 1/2013 | Figaro | G01R 33/0035 | 324/252 |
| 2013/0335069 A1* | 12/2013 | Vig | G01R 33/072 | 324/207.12 |
| 2015/0185279 A1* | 7/2015 | Milano | G01R 31/2884 | 324/750.3 |
| 2015/0185284 A1* | 7/2015 | Milano | G01R 33/072 | 324/251 |
| 2015/0185293 A1* | 7/2015 | Milano | G01R 31/2884 | 324/251 |
| 2015/0276892 A1* | 10/2015 | Butenhoff | G01R 33/072 | 324/251 |
| 2015/0355293 A1* | 12/2015 | Motz | G01R 33/075 | 324/251 |
| 2016/0041235 A1* | 2/2016 | Ausserlechner | G01D 5/145 | 324/244 |
| 2016/0139230 A1* | 5/2016 | Petrie | G01R 31/2884 | 324/225 |
| 2016/0204089 A1* | 7/2016 | Holm | H01L 24/17 | 257/421 |

* cited by examiner

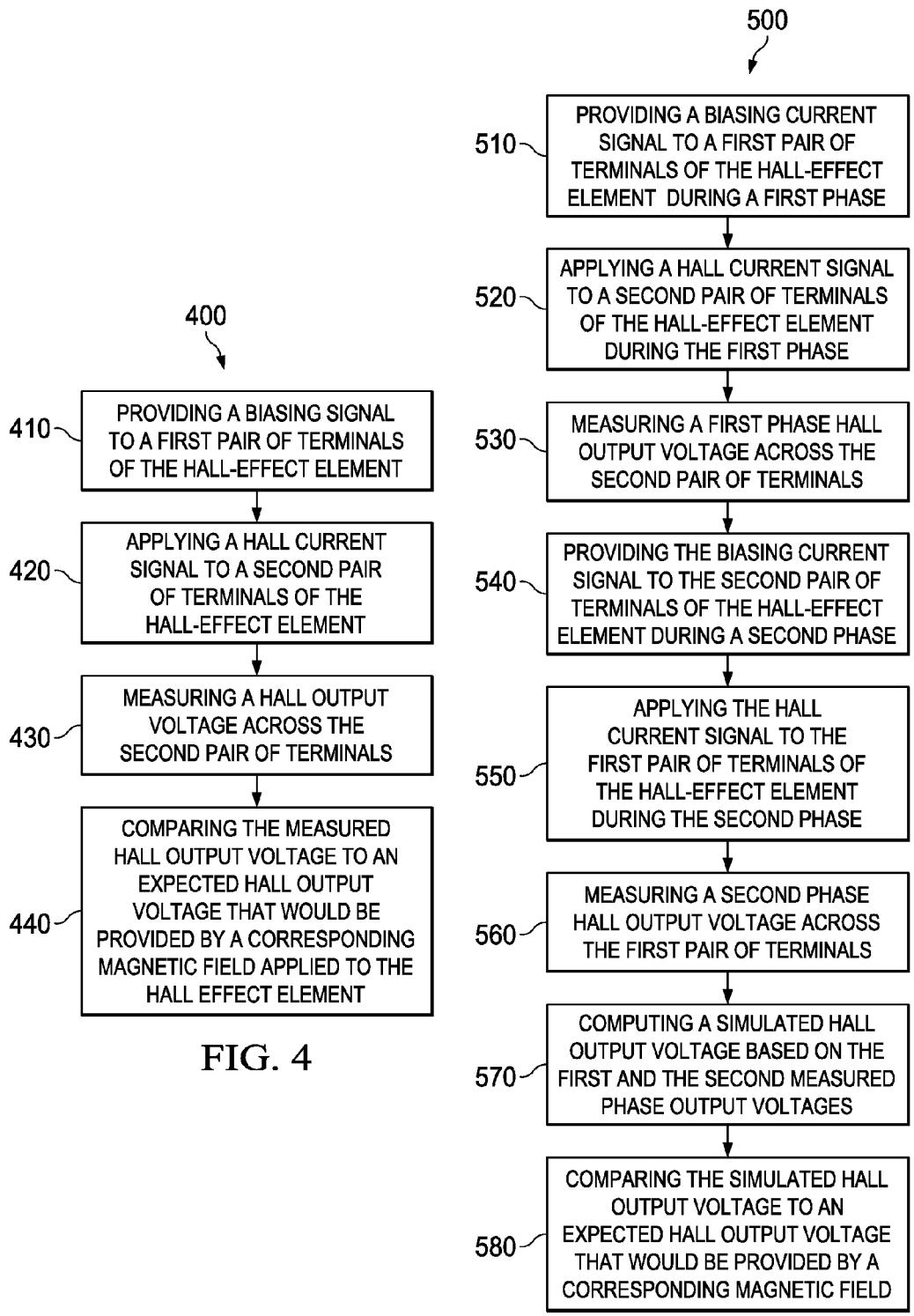

SYSTEMS AND METHODS FOR OPERATING A HALL-EFFECT SENSOR WITHOUT AN APPLIED MAGNETIC FIELD

CROSS-REFERENCE TO RELATED APPLICATION

This application claims the benefit of priority to U.S. Provisional Application No. 61/971,368 filed on 27 Mar. 2014, and entitled "METHOD TO CREATE HALL SENSOR OUTPUT WITHOUT REQUIRING A MAGNETIC FIELD", the entirety of which is herein incorporated by reference.

TECHNICAL FIELD

This disclosure relates to Hall-effect sensors, and more specifically, this disclosure relates to operating a Hall-effect sensor without an applied magnetic field.

BACKGROUND

A Hall-effect element is a solid state device that generates an output voltage, called a Hall output voltage, in response to an applied magnetic field. The Hall output voltage is a function of an applied magnetic field passing through the Hall-effect element and a biasing signal for biasing the Hall-effect element. In normal operations a current flows through the Hall-effect element as a result of electrical biasing. In the absence of the applied magnetic field, the Hall output voltage is substantially zero. In the presence of the applied magnetic field, the Hall output voltage changes according to a strength of the applied magnetic field and the biasing current flowing through the Hall-effect element. The Hall-effect element can be combined with additional circuitry (e.g., signal conditioning circuitry) to form a Hall-effect sensor.

Hall-effect sensors are magnetic field sensors that can be employed in various applications ranging from consumer electronics to industrial controls. For example, in industrial applications, Hall-effect sensors can be used to provide a measure of position, proximity, velocity or directional movement. However, before a Hall-effect sensor can be utilized in a particular application, the Hall-effect sensor needs to be tested to verify that the Hall-effect sensor is operating correctly, for example, as prescribed by a corresponding datasheet. Testing of the Hall-effect sensor requires that precise magnetic fields are generated to simulate the magnetic fields that would be applied to the Hall-effect element in a given application to establish the Hall output voltage across the Hall-effect element. Generating the precise magnetic fields suitably with commercially available testing systems is not possible without additional magnetic field generating devices. For example, the precise magnetic fields can be emulated to verify operations of the Hall-effect sensor by wrapping the Hall-effect element with a coil element and passing currents through the coil element to establish the Hall output voltage across the Hall-effect element.

SUMMARY

This disclosure relates to systems and methods for verifying performance of a Hall-effect sensor. More particularly, this disclosure relates to systems and methods for operating a Hall-effect sensor without applying an external magnetic field to a Hall-effect element of the Hall-effect sensor.

One example relates to a method for confirming an operation of a Hall-effect element comprising providing a biasing signal to a first pair of terminals of the Hall-effect element, applying a Hall current signal to a second pair of terminals of the Hall-effect element, measuring a Hall output voltage across the second pair of terminals and comparing the measured Hall output voltage to an expected Hall output voltage that would be provided by a corresponding magnetic field applied to the Hall-effect element.

Another example relates to a system for confirming an operation of a Hall-effect sensor, the system comprising a bias source that applies a biasing signal to a first pair of terminals of a Hall-effect element of the Hall-effect sensor, a current source that generates a Hall current signal to be applied to a second pair of terminals of the Hall-effect element, a detection system that detects a Hall output voltage of the Hall-effect element and compares the Hall output voltage to an expected Hall output voltage that would be provided by a corresponding magnetic field applied to the Hall-effect element.

Yet another example relates to a circuit for generating Hall output voltages without requiring a magnetic field, the system comprising a variable current source configured to apply a Hall current signal to a first pair of terminals of a Hall-effect element, a biasing signal source configured to apply a biasing signal to a second pair of terminals of the Hall-effect element, the Hall-effect element configured to establish a Hall output voltage signal across the first pair of terminals such as would be generated by a corresponding magnetic field being applied to the Hall-effect element based on the Hall current signal and the biasing signal, and a Hall-effect sensor signal pathway configured to receive the Hall output voltage and generate a corresponding voltage indicative of an operation of the Hall-effect sensor signal pathway.

BRIEF DESCRIPTION OF THE DRAWINGS

FIG. 4 illustrates an example of a method for confirming an operation of a Hall-effect element.

FIG. 5 illustrates an example of a method for confirming an operation of a spinning current Hall-effect sensor.

DETAILED DESCRIPTION

Figure 1:
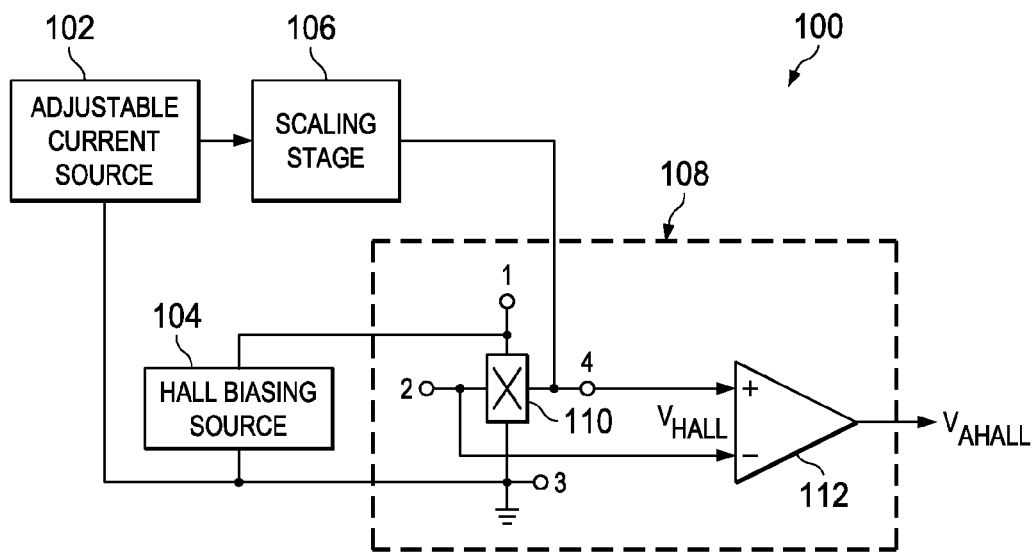
FIG. 1 illustrates an example of a magnetic field simulated Hall-effect sensor system for verifying an operation of a Hall-effect sensor.

Systems and methods are described herein for operating a Hall-effect sensor without utilizing an applied magnetic field. The systems and methods described herein apply a Hall current signal to a Hall-effect element of the Hall-effect sensor and a biasing signal to the Hall-effect element to generate a Hall output voltage across respective terminals of the Hall-effect element such as would be generated by the applied magnetic field. The Hall output voltage across the respective terminals is representative of an actual Hall output voltage that can be generated by the Hall-effect element in response to the applied magnetic field. Thus, the systems and methods described herein provide a Hall output voltage that is indistinguishable from that which can be created by the applied magnetic field.

The systems and methods described herein eliminate the requirement for an external magnetic field to excite the Hall-effect sensor, for example, during testing of the Hall-effect sensor, to verify that the Hall-effect sensor is operating according to predetermined operating parameters. Thus, the systems and methods described herein can be utilized to effectively verify operations of the Hall-effect sensor before the Hall-effect sensor is employed in a given application. Accordingly, the systems and methods described herein can be used to confirm that the Hall-effect sensor is responding properly to a given applied magnetic field without actually applying the given magnetic field to the Hall-effect element by using electrical current signals to simulating the given applied magnetic field.

In general, the systems described herein can be integrated into a Hall-effect integrated circuit (IC) or can be provided as a standalone circuit element (or standalone elements) that can be mounted on a surface of a printed circuit board (PCB). In other examples, the systems described herein can be provided as plug-in elements that can be coupled to sockets (receiving terminals) of the PCB.

The systems and methods described herein provide an approach for verifying operations of the Hall-effect sensor by emulating conditions that can be substantially identical to real conditions that the Hall-effect sensor can experience in the given application. For example, the systems and methods described herein bias the Hall element at a similar biasing point as in the given application and subsequently supply a plurality of Hall current signals to the Hall element to verify an operating range of the Hall-effect sensor. Therefore, the systems and methods described herein provide a lower power consumptive approach to confirm operations of the Hall-effect sensor while substantially reducing testing time and associated testing costs needed to validate a performance (behavior) of the Hall-effect sensor since the applied magnetic field can be emulated.

Furthermore, since the Hall output voltage of the Hall element is indistinguishable from that which can be created by the applied magnetic field, the system and methods described herein provide several advantages. For example, the Hall output voltage can be supplied to an associated Hall-effect sensor conditioning pathway to verify operations of condition systems (e.g., amplification, filtering, conversion, range matching, isolating systems, etc.) along the condition pathway. Additionally or alternatively the Hall output voltage can be supplied to a processing pathway to verify operations of processing systems (e.g., analog-to-digital converters (ADC), a microcontroller, etc.) along the processing pathway.

In another example, the systems and methods described herein can be utilized to calibrate the Hall-effect sensor for offsets and/or cancellations of existing magnetic fields. Further, in another example, the systems and methods described herein can be used to provide real-time calibration of the Hall-effect sensor in the given application by periodically recalibrating the Hall-effect sensor.

In an additional example, the systems and methods described herein can be used to verify an Hall sensor and associated electrical signal paths and circuitry elements in automated test equipment (ATE) environments prior to packaging of the Hall sensor. In another example, the systems and methods described herein can be used for diagnostic purposes (e.g., in safety critical applications) to verify that the Hall-effect sensor is functioning within prescribed operating parameters for a given safety application.

The systems and methods described herein can be utilized with Hall-effect switch sensors and linear Hall-effect sensors constructed from horizontal or vertical Hall elements. Horizontal elements detect magnetic fields that are perpendicular to a Hall-effect sensor and vertical elements detect magnetic fields parallel (in-plane) to the Hall-effect sensor. However, the systems and methods described herein should not be construed as only limited to only these described Hall-effect sensors, but can be used with any type of Hall-effect sensor.

FIG. 1 illustrates an example of a magnetic field simulated Hall-effect sensor system 100 for verifying an operation of a Hall-effect sensor 108. The system 100 can comprise an adjustable current source 102, a Hall biasing source 104 and a scaling stage 106. In some examples, the system 100 can include the Hall-effect sensor 108. The Hall-effect sensor 108 can comprise a Hall element 110 (a semiconductor plate) and a Hall-effect amplifier stage 112 and a plurality of terminals for receiving electrical signals. In some examples, the Hall-effect element 110 can comprise four terminals, as illustrated in FIG. 1, and in other examples Hall-effect element 110 can comprise a number of terminals not equal to four.

The Hall-effect sensor 108 could be any type of Hall-effect sensor. For example, the Hall-effect sensor 108 can be a linear Hall-effect sensor (e.g., an analog Hall sensor) or a switching Hall-effect sensor (e.g., a digital Hall sensor). Additionally, the Hall-effect sensor 108 can comprise additional elements (e.g., chopper stabilization elements) in addition to the Hall element 110 and the Hall-effect amplifier stage 112. Alternatively, the Hall-effect sensor 108 can comprise fewer elements. For example, the Hall-effect amplifier stage 112 could be external to the Hall-effect sensor 108.

The system 100 can be configured to generate an output voltage $V_{HALL}$ at respective terminals 2 and 4 of the Hall-effect element 110 without utilizing an applied magnetic field. The Hall output voltage $V_{HALL}$ generated at the respective terminals 2 and 4 is representative of an actual Hall output voltage that can be generated by the applied magnetic field. Thus, the Hall output voltage $V_{HALL}$ is indistinguishable from the actual Hall output voltage that can be induced across terminals 2 and 4 by the applied magnetic field. Therefore, the system 100 can be configured to emulate Hall output voltages similar to that can be generated by the applied magnetic field to confirm operations of the Hall-effect sensor without actually applying the magnetic field to the Hall-effect element 110.

The system 100 can be implemented, for example, as a circuit, such as an integrated circuit (IC). For instance, the system 100 could be implemented as an Application Specific Integrated Circuit (ASIC). Additionally or alternatively, some of the blocks illustrated on FIG. 1 can be implemented as the IC.

The Hall-effect element 110 can be configured to emulate Hall output voltages such as would be generated by various magnetic field strengths of the applied magnetic field. Thus, the Hall-effect sensor 108 can be tested (e.g., following a manufacturing process of the Hall-effect sensor 108) to verify that the Hall-effect sensor 108 is operating within associated design parameters (e.g., as defined in an associated datasheet of the Hall-effect sensor 108). The Hall-effect sensor 108 can be tested to confirm that for a given test current (Hall current signal), the Hall element 110 generates an associated Hall output voltage such that would be generated had the Hall element 110 been tested by inducing a similar voltage by the applied magnetic field (e.g., by a magnet).

The adjustable current source 102 can be configured to generate a given Hall current signal that the scaling stage 106 can be configured to receive and generate a scaled given Hall current signal based on an associated scaling ratio. In some examples, the scaling stage 106 can be omitted, and the adjustable current source 102 can be configured to provide the corresponding scaled given Hall current signal. In other examples, a user can directly inject a Hall biasing signal from the Hall biasing source 104 between terminals 1 and 3 and the scaled given Hall current signal between terminals 2 and 4.

The adjustable current source 102 can be configured to generate a Hall current signal such that when scaled in magnitude and supplied to the Hall-effect element 110, the Hall-effect element 110 can establish a given Hall output voltage $V_{HALL}$ across terminals 2 and 4 of the Hall-effect element 110. The given Hall output voltage $V_{HALL}$ can be substantially similar to that which can be established across terminals 2 and 4 had the Hall-effect element 110 been in a presence of the applied magnetic field. The adjustable current source 102 can be configured to establish a plurality of different Hall output voltages across terminals 2 and 4 to simulate actual Hall output voltages that can be generated by the applied magnetic field at various field strengths.

Figure 6:
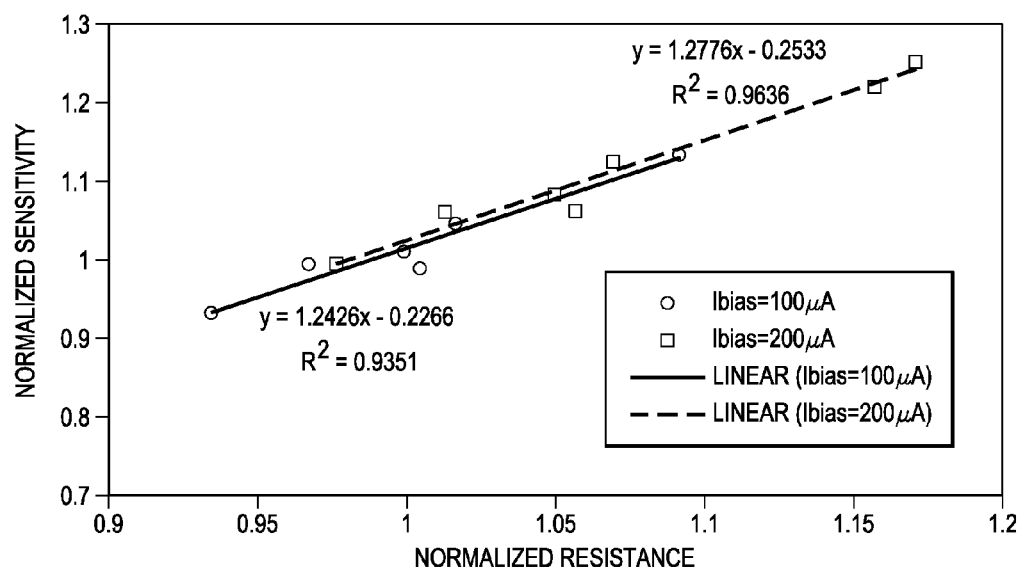
FIG. 6 illustrates a graph showing a sensitivity of a Hall-effect element in relation to a resistivity of the Hall-effect element at various biasing signals.

The adjustable current source 102 can be configured to establish the given Hall output voltage $V_{HALL}$ across terminals 2 and 4 based on a known sensitivity of the Hall-effect element 110. The sensitivity of the Hall-effect element 110 can be determined based on the resistivity of the Hall-effect element 110. For example, FIG. 6 illustrates a graph 600 showing a sensitivity of the Hall-effect element 110 in relation to a resistivity of the Hall-effect element 110 for different biasing points (Hall biasing signals). The resistivity of the Hall element 110 at a particular biasing point (e.g., at 100 micro-amps ($\mu A$)) allows the sensitivity of the Hall element 110 to be readily attained.

The sensitivity of the Hall element 110 indicates how much the Hall output voltage $V_{HALL}$ changes in response to the applied magnetic field. In other words, the sensitivity defines a rate of change of the Hall output voltage $V_{HALL}$ relative to the applied magnetic field. The sensitivity of the Hall element 110 can be utilized to determine for a given amount of applied magnetic field an amount of Hall output voltage $V_{HALL}$ that should be generated across terminals 2 and 4.

The Hall-effect amplifier stage 112 can be configured to receive the given Hall output voltage $V_{HALL}$ and generate an amplified Hall output voltage $V_{AHALL}$. The amplified Hall output voltage $V_{AHALL}$ can be compared to a known given amplified Hall output voltage $V_{AHALL}$ to determine whether the Hall-effect sensor 108 is operating correctly. The comparison determines whether the given Hall output voltage $V_{HALL}$ established across terminals 2 and 4 is similar to an actual Hall output voltage that can be generated by the applied magnetic field.

In another example, the system 100 can be utilized to verify an operating range of the Hall-effect sensor 108 without subjecting the Hall-effect sensor 108 to the applied magnetic field. The operating range of the Hall-effect sensor 108 can be a function of the applied magnetic field. Thus, as the field strength of the applied magnetic field varies (e.g., positively or negatively), the $V_{AHALL}$ generated at the output of the Hall-effect sensor 108 changes accordingly.

The system 100 can be configured to cause the Hall-effect sensor 108 to be cycled through a set of Hall output voltages corresponding to an actual set of Hall output voltages that can be generated in the presence of the applied magnetic field to confirm the operating range of the Hall-effect sensor 108. The Hall biasing source 104 can be configured to generate a biasing signal to bias the Hall-effect element 110 similar to that in the given application. The adjustable current source 102 can be configured to sequentially generate a set of Hall current signals to verify the operating range of the Hall-effect sensor 108. Each of the Hall current signals can be received by the scaling stage 106 and scaled according to a given scaling ratio to generate a set of scaled Hall current signals. The scaling stage 106 supplies each of the scaled Hall current signals to the Hall-effect element 110 to generate the set of Hall output voltages across terminals 2 and 4, which can be received and amplified by the Hall-effect amplifier stage 112 to generate a set of amplified Hall output voltages. The set of amplified Hall output voltages can be utilized to determine whether the Hall-effect element 110 and the Hall-effect sensor 108 are operating correctly.

In another example, the system 100 can be utilized to periodically calibrate the Hall-effect sensor 108 for temperature-offset drifts and mechanical stresses of the Hall-effect sensor 108. For example, the adjustable current source 102 can be configured to provide a reference Hall current signal to establish a reference Hall output voltage across terminals 2 and 4. The reference Hall output voltage can be utilized to calibrate (adjust the sensitivity of) the Hall-effect sensor 108. Thus, the system 100 can be configured to periodically calibrate the Hall-effect sensor 108 to compensate for the temperature-offset drifts and the mechanical stresses, and thereby adjust the Hall-effect sensor 108 back to an expected accuracy and linearity.

In another example, the system 100 can be programmed to compensate for an unwanted Hall output voltage that unwanted magnetic fields (e.g., nearby magnetic fields that can be generated by other systems within proximity of the Hall-effect sensor 108) induce in the Hall-effect sensor 108 by providing a canceling Hall current signal of a given value and polarity to effectively cancel the unwanted Hall output voltage.

Figure 2:
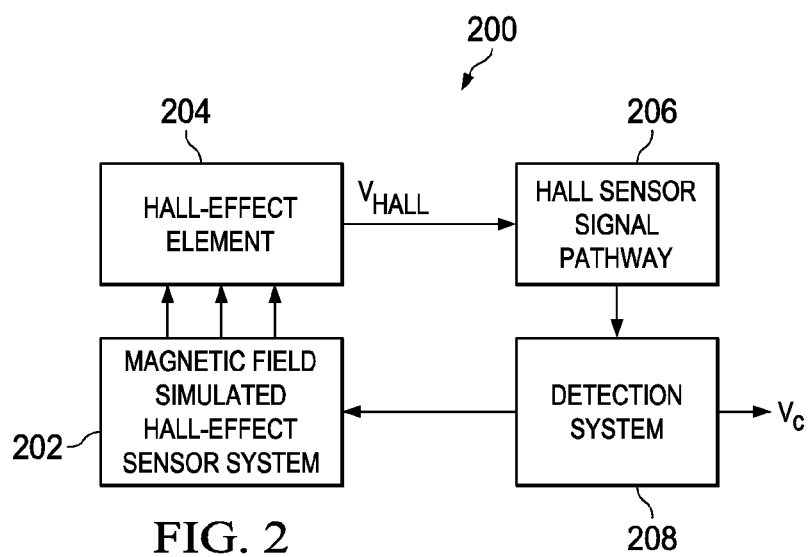
FIG. 2 illustrates an example of a system for verifying an operation of an associated Hall sensor signal pathway.

FIG. 2 illustrates an example of a system 200 for verifying an operation of an associated Hall sensor signal pathway. The system 200 can be included in an IC chip (i.e., IC package). The system 200 can comprise a magnetic field simulated Hall sensor system (MFSHS) 202, a Hall-effect element 204, a Hall sensor signal pathway 206 and a detection system 208. The MFSHS 202 can include an adjustable current source (e.g., the adjustable current source 102 of FIG. 1) and a Hall biasing source (e.g., the Hall biasing source 104 of FIG. 1). In some examples, the MFSHS 202 can include the Hall-effect element 204. The MFSHS 202 can be configured in response to a Hall control signal from the detection system 208 to generate appropriate current signals to cause the Hall-effect element 204 to establish a Hall output voltage $V_{HALL}$ to emulate an actual Hall output voltage that can be established by the Hall-effect element 204 in a presence of an applied magnetic field.

The Hall-effect element 204 can be further configured in response to the detection system 208 to establish a plurality of different Hall output voltages that can be similar to actual Hall output voltages that can be established by varying a magnetic field strength of the applied magnetic field. Establishing the plurality different Hall output voltages at the Hall-effect element 204 allows an operating range of the Hall-effect element 204 to be verified relative to an expected operating range of the Hall-effect sensor.

The output Hall voltage $V_{HALL}$ generated by the Hall-effect element 204 can be supplied to the Hall sensor signal pathway 206 to verify operations of components along the Hall sensor signal pathway 206. For example, the Hall sensor signal pathway 206 can comprise a Hall-effect amplifier stage (e.g., the Hall-effect amplifier stage 112 of FIG. 1) and/or an ADC. The detection system 208 can be configured to monitor the Hall sensor signal pathway 206 (e.g., for a particular signal) to verify that the components therein are operating properly (e.g., operating according to respective defined operating parameters). For example, the detection system 208 can be configured to monitor the Hall sensor signal pathway 206 for a particular voltage signal (a specific result), to determine whether or not the Hall sensor signal pathway 206 is operating correctly (e.g., by comparing the particular voltage signal to an expected voltage signal).

Supplying the Hall output voltage $V_{HALL}$ to the Hall sensor signal pathway 206 allows the components along the Hall sensor signal pathway 206 to be tested without the applied magnetic field. An entire Hall sensor signal pathway 206 and the components therein can be verified by monitoring corresponding signals generated within the sensor signal pathway 206 in response to the Hall output voltage $V_{HALL}$. For example, in safety critical automotive applications, an automotive Hall-effect sensor can be configured on start up of an automobile to generate a test Hall output voltage in response to a safety verification signal. The test Hall output voltage can be supplied to a Hall sensor automotive signal pathway to verify that the Hall sensor automotive signal pathway is operating correctly (e.g., by monitoring the Hall sensor automotive signal pathway for expected automotive pathway voltage signals).

In another example, the detection system 208 can include memory comprising program instructions that can be executed periodically by the detection system 208. The self-testing algorithm causes the detection system 208 to verify operations of a Hall-effect element 204 by (i) cycling the Hall-effect sensor 108 to generate a plurality of Hall output voltages and (ii) comparing the plurality of Hall output voltages to expected Hall output voltages of the Hall-effect element 204 to determine if the Hall-effect element 204 is operating with an expected operated range.

The results of the comparison can be stored in the memory of the detection system 208, and can be either retrieved by another component (e.g., by a processor) or transmitted ("$V_C$" as illustrated in FIG. 2) to the other component by the detection system 208. The results of the comparison can be interpreted to determine if the Hall-effect element 204 requires calibration, for example, by the detection system 208 or the other component.

Figure 3:
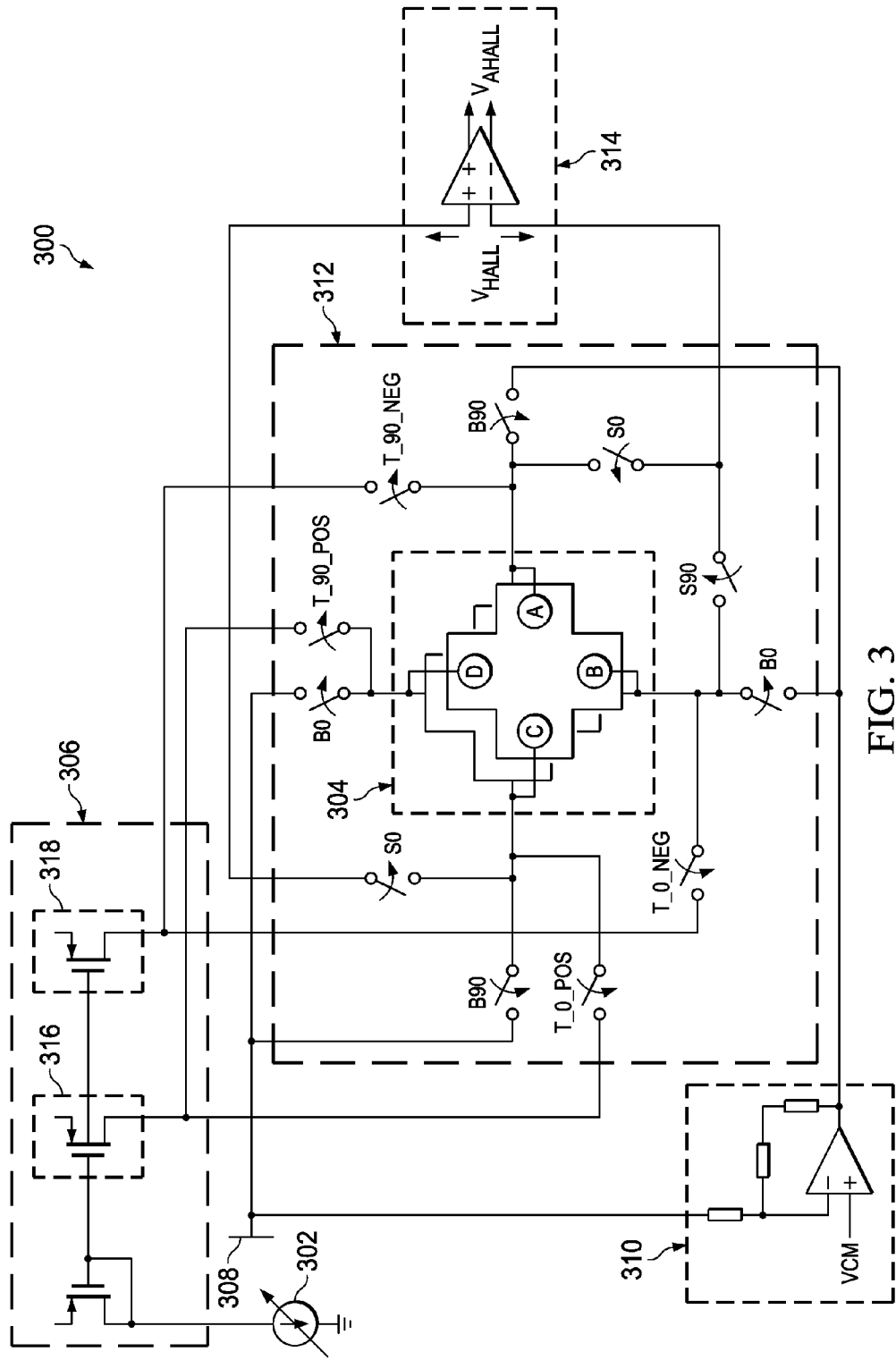
FIG. 3 illustrates an example of a magnetic field simulated spinning current Hall-effect sensor system.

FIG. 3 illustrates an example of a magnetic field simulated spinning current Hall-effect sensor system 300. The system 300 can be included in an IC chip (i.e., IC package). The system 300 can comprise an adjustable current source 302, a scaling stage 306, a Hall biasing source 308, a common-mode voltage (CMV) amplifier stage 310, a switching matrix 312, a Hall-effect element 304 and a Hall sensor signal pathway 314. The Hall-effect element can comprise a set of terminals ("A", "B", "C" and "D", as illustrated in FIG. 3). Alternatively, the system of 300 can comprise one or more Hall-effect element 304 connected in parallel and a set of corresponding terminals.

The switching matrix 312 can comprise a plurality of switches that can be triggered to close and/or open during respective phases (time frames) of an electrical spinning current method to cancel (remove) a Hall offset voltage from a Hall output voltage generated by the Hall-effect element 304. The Hall offset voltage can be substantially canceled via the electrical spinning current method, wherein a biasing signal is spatially rotated (e.g., by a given degree) during phases around the Hall-effect element 304 by the switching matrix 312, while the Hall sensor signal pathway 314 measures a Hall output voltage $V_{HALL}$ across each respective terminal pair of the Hall-effect element 304. The Hall sensor signal pathway 314 can be configured to sum measured Hall output voltages to provide an offset-free Hall output voltage.

In one example, the Hall-effect element 304 can comprise a terminal count equal to four, and the plurality of switches of the switching matrix 312 can be configured to spatially rotate the electrical signals (e.g., by 0°, 90°, 180° and/or 270° from a given terminal relative to another terminal of the Hall-effect element 304). Thus, the biasing signal can be can be spatially rotated around the Hall-effect element 304, while the Hall sensor signal pathway 314 measures the Hall output voltage $V_{HALL}$ across a corresponding respective terminal pair of the Hall-effect element 304.

The CMV amplifier stage 310 can be configured to supply a particular CMV to the switching matrix 312 that reflects an actual CMV that the Hall-effect sensor 304 would be receiving in a given application. The switching matrix 312 can be configured to receive the particular CMV, configure appropriate switches during each phase of the electrical spinning current method and apply the given CMV across respective terminals of the Hall-effect element 304 so that the Hall-effect element 304 is continuously receiving the particular CMV.

In one example, the Hall-effect element 304 can be tested to verify that the Hall-effect element 304 is operating correctly. The system 300 can be configured to emulate a Hall output voltage across a respective pair of terminals of the Hall-effect element 304 such as would be generated by a given applied magnetic field. The Hall-effect element 304 can be tested to verify that the Hall-effect element 304 is operating according to prescribed operating parameters. The Hall-effect element 304 can be tested to confirm that for a given Hall current signal, the Hall-effect element 304 generates an associated Hall output voltage such that would generated had the Hall-effect element 304 been tested by inducing the given Hall current signal by the applied magnetic field.

The Hall biasing source 308 can be configured to provide a biasing signal to the switching matrix 312 to bias the Hall-effect element 304. The adjustable current source 302 can be configured to supply a positive Hall current signal to establish a Hall output voltage across terminals of the Hall-effect element 304 similar to that a positive applied magnetic field can establish across the terminals. The scaling stage 306 can be configured to receive the positive Hall current signal at a positive scaling block 316 and generate a scaled version of the positive Hall current signal based on a given scaling ratio. The scaling stage 306 is a given implementation of the scaling stage 306 and can be implemented differently to generate the scaled version of the positive Hall current signal.

The switching matrix 312 can be configured to receive the biasing signal and the scaled version of the positive Hall current signal, and during a first phase of the electrical spinning current method apply the biasing signal across terminals B and D of the Hall-effect element 304 and the scaled version of the positive Hall current signal across terminals A and C by configuring appropriate switches. A first phase positive Hall output voltage is established across terminals B and D and supplied to the Hall sensor signal pathway 314.

During a second phase of the electrical spinning current method, the switching matrix 312 can be configured to apply the biasing signal across terminals A and C of the Hall-effect element 304 and the scaled version of the positive Hall current signal across terminals B and D by configuring the appropriate switches (in other words configuring appropriate switches to simulate the electrical rotation). A positive second phase Hall output voltage is established across terminals A and C and supplied to the Hall sensor signal pathway 314. Circuit elements within the Hall sensor signal pathway 314 can be configured to receive the first and the second positive phase Hall output voltage and generate a simulated positive Hall output voltage.

The simulated positive Hall output voltage can be compared to an expected positive Hall output voltage corresponding to an actual positive Hall output voltage of the positive applied magnetic field to determine if the Hall-effect element 304 is operating properly. In some examples, results of the comparison can be utilized to re-calibrate the Hall-effect element 304.

The adjustable current source 302 can be further configured to supply a negative Hall current signal. The scaling stage 306 can be configured to receive the negative Hall current signal at a negative scaling block 318 and generate a scaled version of the negative Hall current signal based on the given scaling ratio. The scaled version of the negative Hall current signal is supplied to the switching matrix 312. The switching matrix 312 applies the negative Hall current signal and the biasing signal appropriately during each respective phase of the electrical spinning current method to supply the Hall sensor signal pathway 314 with a first and second negative phase Hall output voltage. The Hall sensor signal pathway 314 receive the first and the second negative phase Hall output voltage and generates a simulated negative Hall output voltage. The simulated negative Hall output voltage can be compared to an expected negative Hall output voltage corresponding to an actual negative Hall output voltage of a negative applied magnetic field to determine if the Hall-effect element 304 is operating properly.

In view of the foregoing structural and functional features described above, an example method will be better appreciated with references to FIGS. 4 and 5. While, for purposes of simplicity of explanation, the example methods of FIGS. 4 and 5 is shown and described as executing serially, it is to be understood and appreciated that the present example is not limited by the illustrated order, as some actions could in other examples occur in different orders, multiple times and/or concurrently from that shown and described herein.

FIG. 4 illustrates an example of a method 400 for confirming an operation of a Hall-effect element (e.g., the Hall-effect element 110 of FIG. 1 or the Hall-effect element 204 of FIG. 2). The method of 400 can be implemented, for example by the system 100 of FIG. 1 or by the system 200 of FIG. 2). At 410, a biasing signal is provided to a first pair of terminals of the Hall-effect element (e.g., terminals 1 and 3 of the Hall-effect element 110 of FIG. 1). At 420, a Hall current signal is applied across a second pair of terminals of the Hall-effect element (e.g., terminals 2 and 4 of the Hall-effect element 110 of FIG. 1) to establish a Hall output voltage across the second pair of terminals. The Hall output voltage across the second pair of terminals is representative of an actual Hall output voltage such as would be generated in a presence of an applied magnetic field by the Hall-effect element. At 420, the Hall output voltage across the second pair of terminals is measured (e.g., by the detection system 208 of FIG. 2). At 430, the measured Hall output voltage is compared to an expected voltage corresponding to the actual Hall output voltage that would be provided by the applied magnetic field to determine if the Hall-effect element is operating correctly.

In other examples, the method of 400 can be implemented to verify an operating range of the Hall-effect element. A biasing signal is provided across the first pair of terminals of the Hall-effect element and the Hall biasing signal corresponding to a set of Hall biasing signals can be sequentially provided to the second pair of terminals to generate a set of Hall output voltages across the second pair of terminals that can be measured and compared to an expected set of Hall output voltages of an expected operating range that would be provided by the corresponding magnetic field at given strengths being applied to the Hall-effect element.

FIG. 5 illustrates an example of a method 500 for confirming an operation of a Hall-effect element of a spinning current Hall-effect sensor. The method of 500 can be implemented, for example, by the magnetic field simulated spinning current Hall-effect sensor system 300 of FIG. 3. At 510, a biasing signal can be provided by a switching matrix (e.g., the switching matrix 312 of FIG. 3) during a first phase to a first pair of terminals of the Hall-effect element. At 520, a Hall current signal can be applied by the switching matrix during a first phase to a second pair of terminals of the Hall-effect element to establish a Hall output voltage similar to that a corresponding magnetic field can establish across the second pair of terminals. At 530, a first phase Hall output voltage across the second pair of terminals is measured.

At 540, the biasing signal can be provided by the switching matrix during a second phase to the second pair of terminals. At 550, the Hall current signal can be applied by the switching matrix during the second phase to the first pair of terminals of to establish the Hall output voltage similar to that a corresponding magnetic field can establish across the first pair of terminals. At 560, a second phase Hall output voltage across the first pair of terminals is measured.

At 570, a simulated Hall output voltage based on the first and the second measured phase Hall output a voltage is computed. At 580, the simulated Hall output voltage is compared to an expected Hall output voltage that would be provided by the corresponding magnetic field being applied to the Hall-effect element to determine if the spinning Hall-effect element is operating correctly.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A method for confirming an operation of a Hall-effect element, the method comprising:
providing a biasing signal to a first pair of terminals of a Hall-effect element;
applying a Hall current signal to a second pair of terminals of the Hall-effect element;
measuring a Hall output voltage across the second pair of terminals;

comparing the measured Hall output voltage to an expected Hall output voltage that would be provided by a corresponding magnetic field being applied to the Hall-effect element; and scaling the Hall current signal prior to applying the Hall current signal to the second pair of terminals based on a given scaling ratio.

2. The method of claim 1, further comprising:
generating the Hall current signal based on a sensitivity of the Hall-effect element and the biasing signal.

3. The method of claim 2, further comprising:
measuring a resistivity of the Hall-effect element at the biasing signal; and
computing the sensitivity of the Hall-effect element based on the resistivity.

4. The method of claim 1, further comprising:
sequentially applying a set of Hall biasing signals to the second pair of terminals to generate a set of Hall output voltages across the second pair of terminals;
sequentially measuring the set out Hall output voltages;
comparing the set of measured Hall output voltages to an expected set of Hall output voltages of an expected operating range that would be provided by the corresponding magnetic field at given strengths being applied to the Hall-effect element; and
adjusting an actual operating range of the Hall-effect element based on the comparing to substantially match the expected operating range.

5. The method of claim 1, wherein the measuring a Hall output voltage across the second pair of terminals comprises:
providing the Hall output voltage to a signal pathway; and
monitoring the signal pathway for a signal pathway output voltage.

6. The method of claim 5, wherein the comparing the measured Hall output voltage to an expected Hall output voltage comprises comparing the signal pathway output voltage to an expected signal pathway output voltage that would be provided by the corresponding magnetic field being applied to the Hall-effect element.

7. The method of claim 1, further comprising:
providing the biasing signal to the first pair of terminals during a first phase;
applying the Hall current signal to a second pair of terminals during the first phase; and
measuring a first phase Hall output voltage across the second pair of terminals.

8. The method of claim 7, further comprising:
providing the biasing signal to the second pair of terminals during a second phase;
applying the Hall current signal to a first pair of terminals during the second phase; and
measuring a second phase Hall output voltage across the first pair of terminals.

9. The method of claim 8, further comprising:
computing a simulated Hall output voltage based on the first and the second measured phase Hall output voltages;
comparing the simulated Hall output voltage to the expected Hall output voltage that would be provided by the corresponding magnetic field being applied to the Hall-effect element.

10. A system for confirming an operation of a Hall-effect sensor, the system comprising:
a bias source that applies a bias signal to a first pair of terminals of a Hall-effect element of a Hall-effect sensor;

a current source that generates a Hall current signal to be applied to a second pair of terminals of a Hall-effect element of the Hall-effect sensor, the current source is an adjustable current source and is configured to generate the Hall current signal based on a sensitivity of the Hall-effect element and the bias current signal; and
a detection system that detects a Hall output voltage of the Hall-effect element and compares the Hall output voltage to an expected Hall output voltage that would be provided by a corresponding magnetic field being applied to the Hall-effect element.

11. The system of claim 10, wherein the detection system is configured to determine whether the Hall output voltage falls within an expected operating range of the Hall-effect element.

12. The system of claim 10, further comprising:
a Hall sensor signal pathway that generates a signal pathway output voltage based on the Hall output voltage, the detection system being configured to compare the signal pathway output voltage to an expected signal pathway output voltage that would be provided by the corresponding magnetic field being applied to the Hall-effect element.

13. The system of claim 10, further comprising,
a switching matrix comprising a plurality of switching devices configured to open and close to provide an electrical current spinning cycle, the switching matrix being configured to received the biasing signal and the Hall current signal during each phase of the electrical current spinning cycle.

14. The system of claim 13, wherein the switching matrix is further configured to:
provide during a first phase of the electrical current spinning cycle, the biasing signal across the first pair of terminals;
apply during the first phase, the Hall current signal across the second pair of terminals to establish a first phase Hall output voltage across the second pair of terminals;
provide during a second phase of the electrical current spinning cycle, the biasing signal across the second pair of terminals;
apply during the second phase, the Hall current signal across the first pair of terminals to establish a second phase Hall output voltage across the first pair of terminals; and
supply the first and the second phase Hall output voltages to the Hall sensor signal pathway, the Hall sensor signal pathway being configured to compute a simulated Hall output voltage based on the first and the second phase Hall output voltages, the detection system being configured to compare the simulated Hall output voltage to an expected simulated Hall output voltage that would be provided by the corresponding magnetic field being applied to the Hall-effect element.

15. A circuit for generating Hall output voltages without requiring a magnetic field, the circuit comprising:
a Hall-effect sensor configured to establish a Hall output voltage signal across a first pair of terminals of a Hall-effect element of the Hall-effect sensor based on a Hall current signal, such as would be generated by a corresponding magnetic field being applied to the Hall-effect sensor, and a biasing signal across a second pair of terminals of the Hall-effect element;
a variable current source configured to apply the Hall current signal to the first pair of terminals of the Hall-effect element;

a biasing current source configured to apply the biasing signal to the second pair of terminals of the Hall-effect element;

a common-mode voltage amplifier stage configured to apply across a respective pair of terminals of the Hall-effect element a common-mode voltage; and a Hall-effect sensor signal pathway configured to receive the Hall output voltage and generate a corresponding voltage indicative of an operation of the Hall-effect sensor signal pathway.

16. The circuit of claim 15, further comprising a plurality of switches configured to:

provide during a first phase of an electrical current spinning cycle the biasing signal across the first pair of terminals and apply during the first phase the Hall current signal across the second pair of terminals to establish a first phase Hall output voltage across the second pair of terminals; and provide during a second phase of the electrical current spinning cycle the biasing signal across the second pair of terminals and apply during the second phase the Hall current signal across the first pair of terminals to establish a second phase Hall output voltage across the first pair of terminals.

17. The circuit of claim 16, further comprising:

a processor configured to receive the first and the second phase Hall output voltages and compute a simulated Hall output voltage, the processor being further configured to compare the simulated Hall output voltage to an expected Hall output voltage, the expected Hall output voltage corresponding to an actual Hall output voltage such as would be generated by the corresponding magnetic field being applied to the Hall-effect element.

* * * * *